(12) United States Patent
Yang et al.

(10) Patent No.: US 7,928,758 B2
(45) Date of Patent: Apr. 19, 2011

(54) TRANSISTOR GATE DRIVING CIRCUIT WITH POWER SAVING OF POWER CONVERTER

(75) Inventors: Ta-Yung Yang, Taoyuan (TW); Chuan-Chang Li, Sinfong Township, Hsinchu County (TW)

(73) Assignee: System General Corp., Taipei Hsien (TW)

( * ) Notice: Subject to any disclaimer, the term of this patent is extended or adjusted under 35 U.S.C. 154(b) by 0 days.

(21) Appl. No.: 12/471,538

(22) Filed: May 26, 2009

(65) Prior Publication Data

US 2009/0309634 A1    Dec. 17, 2009

(51) Int. Cl.
*H03K 17/16*    (2006.01)
*H03K 19/003*   (2006.01)
(52) U.S. Cl. .................. 326/33; 326/30; 326/34; 326/87
(58) Field of Classification Search ........................ None
See application file for complete search history.

(56) References Cited

U.S. PATENT DOCUMENTS

| 5,731,731 | A  | * | 3/1998  | Wilcox et al. | ................. 327/403 |
| 7,304,464 | B2 | * | 12/2007 | Weng et al.   | ................. 323/285 |
| 7,479,770 | B2 | * | 1/2009  | Kohout et al. | ................. 323/271 |

* cited by examiner

*Primary Examiner* — Anh Q Tran
(74) *Attorney, Agent, or Firm* — Ming Chow; Sinorica, LLC

(57) ABSTRACT

A transistor gate driving circuit is developed for power saving. It includes a first high-side transistor, a second high-side transistor and a low-side transistor. A voltage clamp device is connected to the gate terminal of the first high-side transistor to limit the maximum output voltage. A detection circuit is coupled to detect a feedback signal of the power converter. The feedback signal is correlated to the output load of the power converter. The detection circuit will generate a disable signal in response to the level of the feedback signal. The disable signal is coupled to disable the second high-side transistor once the level of the feedback signal is lower than a threshold.

19 Claims, 2 Drawing Sheets

TRANSISTOR GATE DRIVING CIRCUIT WITH POWER SAVING OF POWER CONVERTER

BACKGROUND OF THE INVENTION

1. Field of Invention

The present invention relates to power converters, and more particularly, the present invention relates to a transistor gate driving circuit.

2. Description of Related Art

Recently, power converter designs are used to support high output current that might be greater than 100 Amperes. A key challenge at this power level is to reduce power loss to keep system efficiency as high as possible. The power converters thus provide a gate drive voltage that is a function of the output current. Typically, the gate voltage is in the higher range for heavy-load currents and it is lower range for light-load currents. These voltages give optimal gate drive efficiency for both load conditions. The circuit operation of the gate driving circuit is shown in a prior art of "Adaptive gate drive voltage circuit" by Ahmad, U.S. Pat. No. 7,265,601. However, it requires additional device such as current-sense resistor that causes additional power consumption. In traditional design, the voltage between the gate terminal and the source terminal always keeps at a fixed voltage. The switching loss will be dominated when the output currents are at light-load.

SUMMARY OF THE INVENTION

The transistor gate driving circuit is for power saving of power converter according to the present invention. It includes a switch circuit that generates a drive signal for driving a transistor of the power converter. A control circuit controls the switch circuit in response to a switching signal. A detection circuit generates a disable signal to limit the drive signal in response to a load condition of the power converter. The disable signal limits the drive signal to reduce a switching loss at a light-load when the load condition of the power converter is a light-load.

BRIEF DESCRIPTION OF ACCOMPANIED DRAWINGS

The accompanying drawings are included to provide a further understanding of the present invention, and are incorporated in and constitute a part of this specification. The drawings illustrate embodiments of the present invention and, together with the description, serve to explain the principles of the present invention. In the drawings, FIG. 1 is a circuit schematic of a buck power converter according to the present invention.

DETAILED DESCRIPTION OF PREFERRED EMBODIMENTS

Figure 1:
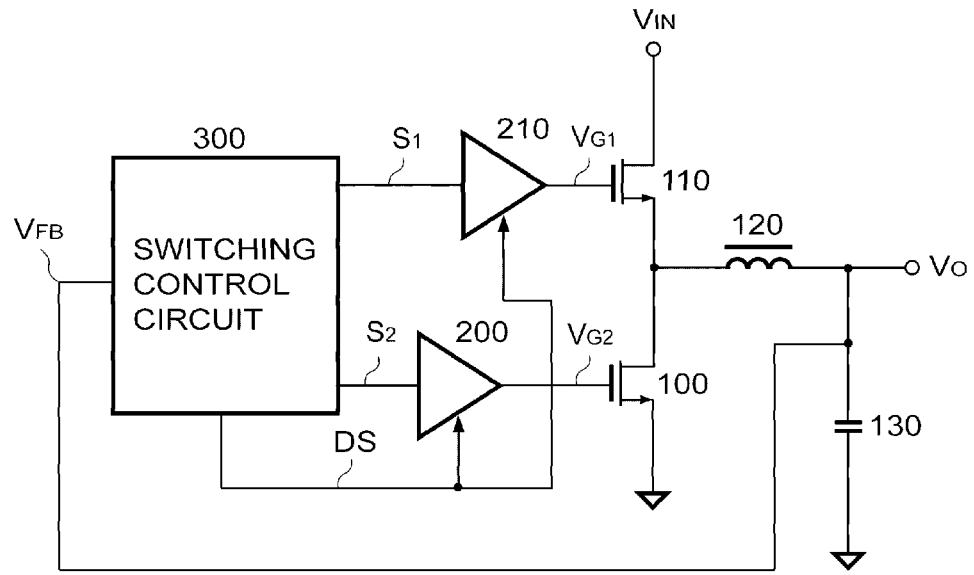

FIG. 1 shows a circuit schematic of a buck power converter according to the present invention. The buck power converter includes a first transistor 110, a first transistor gate driving circuit 210, a second transistor 100, a second transistor gate driving circuit 200, a filtering inductor 120, a filtering capacitor 130 and a switching control circuit 300. The first transistor 110 and the second transistor 100 are connected in series. Two transistors 110 and 100 develop a synchronous buck power converter to switch the filtering inductor 120. The transistor gate driving circuits 210 and 200 generate a first gate drive signal $V_{G1}$ and a second gate drive signal $V_{G2}$ to switch the transistors 110 and 100 respectively. The first transistor 110 has a drain terminal that receives an input voltage $V_{IN}$ and a gate terminal that is coupled to an output terminal of the first transistor gate driving circuit 210. The second transistor 100 has a drain terminal that is coupled to a source terminal of the first transistor 110, a gate terminal that is coupled to an output terminal of the second transistor gate driving circuit 200, and a source terminal that is coupled to a ground.

An input terminal of the filtering inductor 120 is coupled to the source terminal of the first transistor 110 and the drain terminal of the second transistor 100. An output terminal of the filtering inductor 120 receives an output voltage $V_O$ and is also coupled to a first terminal of the filtering capacitor 130. A second terminal of the filtering capacitor 130 is coupled to the ground. The switching control circuit 300 generates a first switching signal $S_1$ and a second switching signal $S_2$ to control the transistor gate driving circuits 210 and 200 in accordance with a feedback signal $V_{FB}$ respectively. The feedback signal $V_{FB}$ generated at the first terminal of the filtering capacitor 130 is proportional to the output voltage $V_O$ and is correlated to an output load (not shown in figure) of the power converter. The switching control circuit 300 also generates a disable signal DS to control the gate driving circuits 210 and 200.

The switching loss of driving transistor includes a capacitance loss $P_{LOSS}$ that is caused by the gate-input capacitance $C_{iss}$ of the transistors 110 and 100. It can be expressed as, $$P_{Loss} = \frac{1}{2} \times C_{iss} \times V_G^2 \times f_W \qquad (1)$$

where $f_W$ is the switching frequency of the gate drive signals $V_{G1}$ and $V_{G2}$. $V_G$ is a voltage level of the gate drive signals $V_{G1}$ and $V_{G2}$. As mentioned equation, reducing the voltage level $V_G$ of the gate drive signals $V_{G1}$ and $V_{G2}$ will reduce the switching loss of the power converter at light-load.

Figure 2:
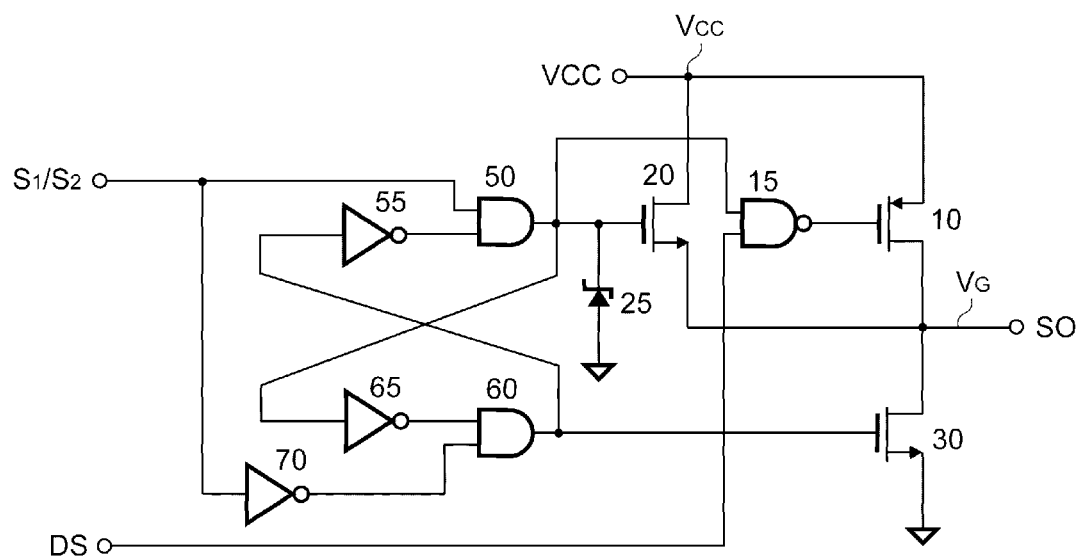
FIG. 2 shows a circuit diagram of a gate driving circuit according to the present invention.

FIG. 2 shows a circuit diagram of a gate driving circuit according to the present invention. It also represents both the transistor gate driving circuits 210 and 200 (as shown in FIG. 1). The gate driving circuit includes an input terminal VCC, an output terminal SO, a switch circuit and a control circuit. The input terminal VCC receives a supply voltage $V_{CC}$. The output terminal SO generates a drive signal $V_G$ for driving the gate terminals of the transistors 110 and 100 respectively (as shown in FIG. 1). The drive signal $V_G$ also represents both the gate drive signals $V_{G1}$ and $V_{G2}$. The switch circuit includes a first high-side transistor 20, a second high-side transistor 10 and a low-side transistor 30. The first high-side transistor 20 and the low-side transistor 30 can be the N-type transistors according to one embodiment of the present invention, and the second high-side transistor 10 can be the P-type transistor according to one embodiment of the present invention.

The switch circuit is utilized to generate the drive signal $V_G$. The first high-side transistor 20 has a drain terminal that is coupled to the input terminal VCC to receive the supply voltage $V_{CC}$ and a source terminal that is coupled to the output terminal SO and generates the drive signal $V_G$. The second high-side transistor 10 has a source terminal that is coupled to the input terminal VCC to receive the supply voltage $V_{CC}$ and a drain terminal that is coupled to the output terminal SO and the source terminal of the first high-side transistor 20. The drain terminal of the second high-side transistor 10 generates the drive signal $V_G$. The low-side transistor 30 has a drain terminal that is coupled to the output terminal SO, the drain terminal of the second high-side transistor 10 and the source terminal of the first high-side transistor 20, a source terminal that is coupled to the ground. The drain terminal of the low-side transistor 30 generates the drive signal $V_G$.

The control circuit includes an NAND gate 15, a voltage clamp device 25, AND gates 50, 60 and inverters 55, 65, 70. The control circuit is utilized to control the switch circuit in response to the switching signal $S_1$ or $S_2$. An input terminal of the AND gate 50 is coupled to the switching control circuit 300 (as shown in FIG. 1) to receive the switching signal $S_1$ or $S_2$. An input terminal of the AND gate 60 is coupled to the switching control circuit 300 to receive the switching signal $S_1$ or $S_2$ through the inverter 70. Another input terminal of the AND gate 50 is coupled to an output terminal of the AND gate 60 through the inverter 55. Another input terminal of the AND gate 60 is coupled to an output terminal of the AND gate 50 through the inverter 65.

The output terminal of the AND gate 50 is coupled to a gate terminal of the first high-side transistor 20 to control the on/off status of the first high-side transistor 20. The output terminal of the AND gate 60 is coupled to a gate terminal of the low-side transistor 30 to control the on/off status of the low-side transistor 30. An input terminal of the NAND gate 15 is coupled to the output terminal of the AND gate 50. Another input terminal of the NAND gate 15 receives the disable signal DS that is coupled to the switching control circuit 300. An output terminal of the NAND gate is coupled to a gate terminal of the second high-side transistor 10 to control the on/off status of the second high-side transistor 10. Therefore, the control circuit is coupled to control the first high-side transistor 20, the second high-side transistor 10 and the low-side transistor 30 in response to the switching signal $S_1$ or $S_2$. The voltage clamp device 25 is coupled to the gate terminal of the first high-side transistor to clamp the maximum output voltage of the drive signal $V_G$. It means that the maximum voltage level of the drive signal $V_G$ is clamped by the voltage clamp device 25. The disable signal DS is coupled to the control circuit to disable the second high-side transistor 10 through the NAND gate 15 of the control circuit.

Figure 3:
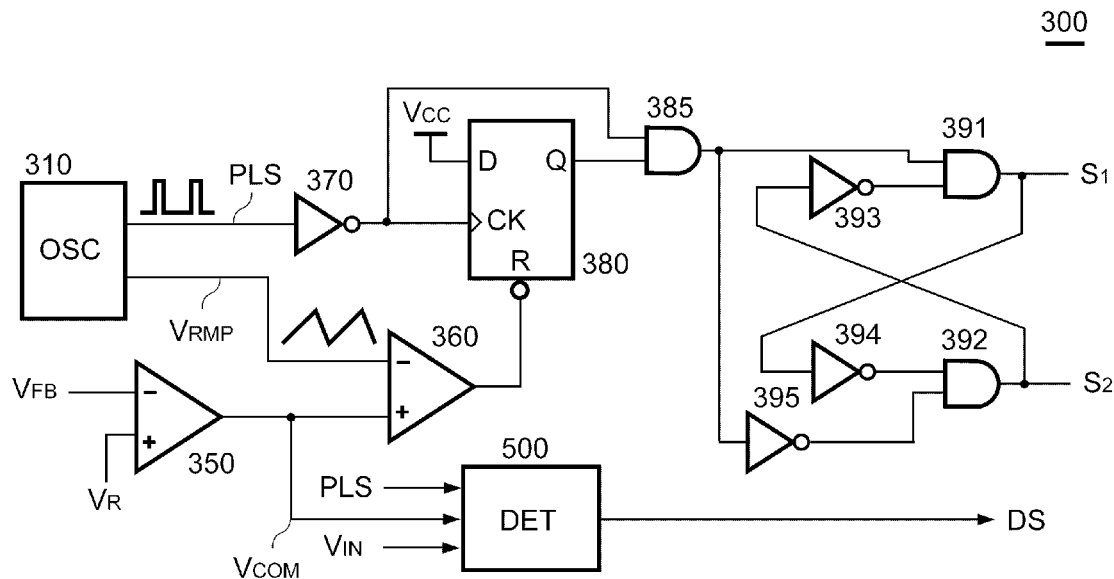
FIG. 3 shows a circuit diagram of the switching control circuit according to the present invention.

FIG. 3 shows a circuit diagram of the switching control circuit 300 according to the present invention. The switching control circuit 300 includes an oscillator (OSC) 310, an inverter 370, a D-flip-flop 380, a AND gate 385, an error amplifier 350, a comparator 360, a detection circuit (DET) 500 and an output driver. The oscillator 310 generates a pulse signal PLS and a ramp signal $V_{RMP}$. A clock-input terminal CK of the D-flip-flop 380 receives the pulse signal PLS though the inverter 370. An input terminal D of the D-flip-flop 380 receives the supply voltage $V_{CC}$. A positive input terminal of the error amplifier 350 receives a reference voltage $V_R$. A negative input terminal of the error amplifier 350 receives the feedback signal $V_{FB}$ to generate an error signal $V_{COM}$.

A negative input terminal of the comparator 360 is coupled to the oscillator 310 to receive the ramp signal $V_{RMP}$. A positive input terminal of the comparator 360 is coupled to an output terminal of the error amplifier 350 to receive the error signal $V_{COM}$. An output terminal of the comparator 360 is coupled to a reset-input terminal R of the D-flip-flop 380 to reset the D-flip-flop 380. Once the ramp signal $V_{RMP}$ is larger than the error signal $V_{COM}$, the output terminal of the comparator 360 resets the D-flip-flop 380. An output terminal of the inverter 370 and an output terminal Q of the D-flip-flop 380 are coupled to input terminals of the AND gate 385.

The output driver includes AND gates 391, 392 and inverters 393, 394, 395. An input terminal of the output driver is coupled to an output terminal of the AND gate 385 to generate the first switching signal $S_1$ and the second switching signal $S_2$. The switching signals $S_1$ and $S_2$ are two reverse and non-overlap signals to control the transistor gate driving circuits 210 and 200 (as shown in FIG. 1). An input terminal of the AND gate 391 is coupled to the output terminal of the AND gate 385. An input terminal of the AND gate 392 is coupled to the output terminal of the AND gate 385 through the inverter 395. Another input terminal of the AND gate 392 is coupled to an output terminal of the AND gate 391 through the inverter 394. Another input terminal of the AND gate 391 is coupled to an output terminal of the AND gate 392 through the inverter 393.

The detection circuit 500 is coupled to the output terminal of the power converter through the error amplifier 350 to generate the disable signal DS in response to the level of the feedback signal $V_{FB}$. It means the detection circuit 500 detecting the feedback signal $V_{FB}$ of the power converter. The level of the feedback signal $V_{FB}$ is correlated to the load condition of the power converter. The detection circuit 500 is further coupled to the input terminal of the power converter and the oscillator 310 to receive the input voltage $V_{IN}$ and the pulse signal PLS. The input voltage $V_{IN}$ is also an input signal. When the output terminal of the power converter is at heavy-load, the level of the error signal $V_{COM}$ is increased in response to the decrease of the feedback signal $V_{FB}$. A pulse width of the first switching signal $S_1$ and the second switching signal $S_2$ is increased in accordance with the increase of the error signal $V_{COM}$. The level of the error signal $V_{COM}$ is decreased in response to the increase of the feedback signal $V_{FB}$ when the output terminal of the power converter is at light-load. The pulse width of the first switching signal $S_1$ and the second switching signal $S_2$ is decreased in accordance with the decrease of the error signal $V_{COM}$.

Figure 4:
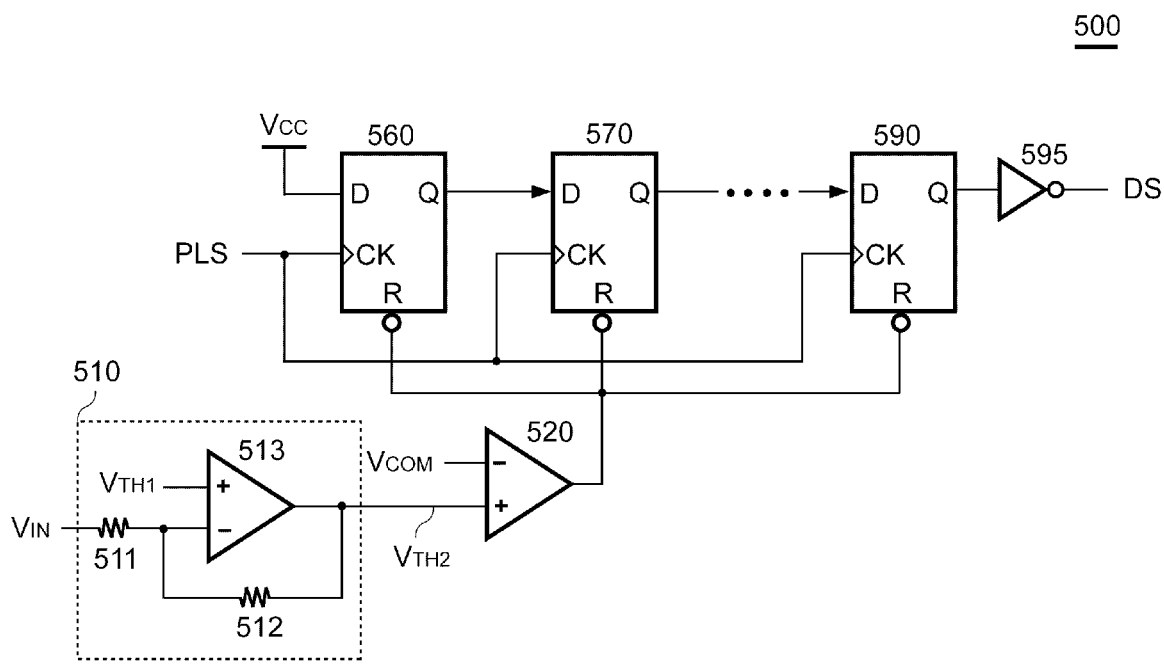
FIG. 4 shows a circuit diagram of the detection circuit according to the present invention.

FIG. 4 shows a circuit diagram of the detection circuit 500 according to the present invention. The detection circuit 500 includes an input detector 510, a comparator 520, an inverter 595 and a delay circuit. The input detector 510 comprises an operational amplifier 513, a resistor 511 and a resistor 512. D-flip-flops 560, 570 . . . 590 develop the delay circuit. A negative input terminal of the operational amplifier 513 is coupled to the input terminal of the power converter to receive the input voltage $V_{IN}$ through the resistor 511. A positive input terminal of the operational amplifier 513 receives a first threshold signal $V_{TH1}$ for generating a second threshold signal $V_{TH2}$ at an output terminal of the operational amplifier 513. The resistor 512 is coupled between the negative input terminal and the output terminal of the operational amplifier 513.

A positive input terminal of the comparator 520 is coupled to the output terminal of the operational amplifier 513 to receive the second threshold signal $V_{TH2}$. The second threshold signal $V_{TH2}$ is correlated to the input voltage $V_{IN}$. A negative input terminal of the comparator 520 receives the error signal $V_{COM}$. An output terminal of the comparator 520 is coupled to reset-input terminals R of the delay circuit to reset the D-flip-flops 560, 570 . . . 590. An input terminal D of the D-flip-flops 560 receives the supply voltage $V_{CC}$. The D-flip-flops 560, 570 . . . 590 are connected in series. Clock-input terminals CK of the delay circuit receive the pulse signal PLS of the oscillator 310 (as shown in FIG. 3). An output terminal of the delay circuit generates the disable signal DS through the inverter 595.

Referring to the input detector 510 of FIG. 4, the second threshold signal $V_{TH2}$ is decreased in response to the increase of the input voltage $V_{IN}$ for compensating the pulse width of the first switching signal $S_1$ and the second switching signal $S_2$. When the output terminal of the power converter is at heavy-load and the error signal $V_{COM}$ is larger than the second threshold signal $V_{TH2}$, the output of the comparator 520 is at a low-level and the D-flip-flops 560, 570 . . . 590 are reset. As shown in FIG. 1, the output voltage $V_O$ and the feedback signal $V_{FB}$ is decreased in response to the increase of the load condition. As shown in FIG. 3, because of the amplifier operation of the error amplifier 350, the error signal $V_{COM}$ is increased in accordance with the decrease of the feedback signal $V_{FB}$. The error signal $V_{COM}$ being larger than the second threshold signal $V_{TH2}$ represents the load condition of the power converter being larger than the second threshold signal $V_{TH2}$. The output terminal of the comparator 520 is coupled to reset the delay circuit once the error signal $V_{COM}$ is larger than the second threshold signal $V_{TH2}$. The disable signal DS is at a high-level and coupled to the control circuit (as shown in FIG. 2). Referring to FIG. 2, the control circuit receives the disable signal DS to enable the second high-side transistor 10 through the NAND gate 15. Therefore, the drive signal $V_G$ can get the supply voltage $V_{CC}$ to switch the transistors 110 and 100 at heavy-load. At this time, the increase of the input voltage $V_{IN}$ doesn't affect the output of the comparator 520 and the on/off status of the disable signal DS.

The level of the error signal $V_{COM}$ is decreased when the output terminal of the power converter is at light-load. The output of the comparator 520 is at a high-level and doesn't reset the D-flip-flops 560, 570 . . . 590 once the error signal $V_{COM}$ is lower than the second threshold signal $V_{TH2}$. As shown in FIG. 1, the output voltage $V_O$ and the feedback signal $V_{FB}$ is increased in response to the decrease of the load condition. As shown in FIG. 3, because of the amplifier operation of the error amplifier 350, the error signal $V_{COM}$ is decreased in accordance with the increase of the feedback signal $V_{FB}$. The error signal $V_{COM}$ being lower than the second threshold signal $V_{TH2}$ represents the level of the feedback signal $V_{FB}$ (as shown in FIG. 1) being lower than the second threshold signal $V_{TH2}$ and the load condition of the power converter being lower than the second threshold signal $V_{TH2}$. The delay circuit provides a delay time for generating the disable signal DS. The output terminal of the comparator 520 doesn't reset the delay circuit once the error signal $V_{COM}$ is lower than the second threshold signal $V_{TH2}$. After the delay time, the disable signal DS is at a low-level in response to the pulse signal PLS. Referring to FIG. 2, the control circuit receives the disable signal DS to disable the second high-side transistor 10 through the NAND gate 15. Therefore, the voltage level of the drive signal $V_G$ can be limited by the voltage clamp device 25 as the maximum output voltage to switch the transistors 110 and 100 at light-load. The voltage level of the drive signal $V_G$ at light-load is lower than the voltage level of the drive signal $V_G$ at heavy-load. In other words, reducing the voltage level of the drive signal $V_G$ will reduce the switching loss of the power converter at light-load. At this time, the second threshold signal $V_{TH2}$ is decreased in response to the increase of the input voltage $V_{IN}$ for compensating the pulse width of the first switching signal $S_1$ and the second switching signal $S_2$.

According to above, the detection circuit 500 generates the disable signal DS to limit the voltage level of the drive signal $V_G$ in response to the load condition of the power converter. The disable signal DS disables the second high-side transistor 10 to reduce the switching loss at the light-load once the load condition of the power converter is lower than the second threshold signal $V_{TH2}$. The load condition of the power converter being lower than the second threshold signal $V_{TH2}$ represents the load condition of the power converter being a light-load.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A transistor gate driving circuit with power saving of power converter, comprising:
   a first high-side transistor, having a drain terminal to receive a supply voltage, and a source terminal to generate a drive signal for driving a gate terminal of a transistor of the power converter;
   a second high-side transistor, having a source terminal to receive the supply voltage, and a drain terminal to generate the drive signal;
   a low-side transistor, having a drain terminal to generate the drive signal, and a source terminal coupled to a ground;
   a control circuit, coupled to control gate terminals of the first high-side transistor, the second high-side transistor and the low-side transistor in response to a switching signal; and
   a detection circuit, generating a disable signal to limit the drive signal in response to a load condition of the power converter, wherein the disable signal is coupled to disable the second high-side transistor to reduce a switching loss at a light-load once the load condition of the power converter is lower than a threshold.

2. The transistor gate driving circuit as claimed in claim 1, wherein the control circuit further comprises a voltage clamp device coupled to the gate terminal of the first high-side transistor to clamp a maximum output voltage of the drive signal.

3. The transistor gate driving circuit as claimed in claim 1, wherein the detection circuit is coupled to an output terminal of the power converter to receive a feedback signal for generating the disable signal, the feedback signal is correlated to the load condition of the power converter.

4. The transistor gate driving circuit as claimed in claim 1, wherein the detection circuit is further coupled to an input terminal of the power converter to receive an input signal, the threshold is decreased in response to the increase of the input signal.

5. The transistor gate driving circuit as claimed in claim 1, wherein the detection circuit further comprises a delay circuit providing a delay time for generating the disable signal once the load condition of the power converter is lower than the threshold.

6. The transistor gate driving circuit as claimed in claim 1, wherein the detection circuit further comprises an input detector coupled to an input terminal of the power converter to receive an input signal for generating the threshold.

7. The transistor gate driving circuit as claimed in claim 1, wherein the first high-side transistor and the low-side transistor can be N-type transistors, the second high-side transistor can be P-type transistor.

8. The transistor gate driving circuit as claimed in claim 1, wherein the switching signal is generated by a switching control circuit.

9. A transistor gate driving circuit with power saving of power converter, comprising:

a switch circuit, generating a drive signal for driving a transistor of the power converter;

a control circuit, controlling the switch circuit in response to a switching signal; and a detection circuit, generating a disable signal to limit the drive signal in response to a load condition of the power converter, wherein the disable signal limits the drive signal when the load condition of the power converter is a light-load.

10. The transistor gate driving circuit as claimed in claim 9, wherein the switch circuit comprises:

a first high-side transistor, receiving a supply voltage and generating the drive signal for driving the transistor of the power converter;

a second high-side transistor, receiving the supply voltage and generating the drive signal; and a low-side transistor, generating the drive signal and coupled to a ground.

11. The transistor gate driving circuit as claimed in claim 10, wherein the second high-side transistor is disabled by the disable signal to reduce a switching loss at the light-load.

12. The transistor gate driving circuit as claimed in claim 10, wherein the control circuit further comprises a voltage clamp device coupled to the first high-side transistor to clamp a maximum output voltage of the drive signal.

13. The transistor gate driving circuit as claimed in claim 10, wherein the first high-side transistor and the low-side transistor can be N-type transistors, the second high-side transistor can be P-type transistor.

14. The transistor gate driving circuit as claimed in claim 9, wherein the detection circuit further comprises a delay circuit providing a delay time for generating the disable signal once the load condition of the power converter is a light-load.

15. The transistor gate driving circuit as claimed in claim 9, wherein the detection circuit is coupled to an output terminal of the power converter to receive a feedback signal for generating the disable signal, the feedback signal is correlated to the load condition of the power converter.

16. The transistor gate driving circuit as claimed in claim 9, wherein the load condition of the power converter is the light-load once the load condition of the power converter is lower than a threshold.

17. The transistor gate driving circuit as claimed in claim 16, wherein the detection circuit is further coupled to an input terminal of the power converter to receive an input signal, the threshold is decreased in response to the increase of the input signal.

18. The transistor gate driving circuit as claimed in claim 16, wherein the detection circuit further comprises an input detector coupled to an input terminal of the power converter to receive an input signal for generating the threshold.

19. The transistor gate driving circuit as claimed in claim 9, wherein the switching signal is generated by a switching control circuit.

* * * * *